United States Patent [19]
Abe

[11] Patent Number: 5,394,348
[45] Date of Patent: Feb. 28, 1995

[54] CONTROL SYSTEM FOR SEMICONDUCTOR CIRCUIT TESTING SYSTEM

[75] Inventor: Nobuaki Abe, Yamagata, Japan

[73] Assignee: NEC Corporation, Japan

[21] Appl. No.: 885,151

[22] Filed: May 18, 1992

[30] Foreign Application Priority Data

May 31, 1991 [JP] Japan .................................. 3-155322

[51] Int. Cl.6 ............................................. G06F 15/20
[52] U.S. Cl. .................................... 364/580; 364/552; 371/29.1
[58] Field of Search ............... 364/579, 578, 580, 550, 364/551.01, 552, 489, 490; 371/23, 24, 27, 26, 28, 29.1

[56] References Cited

U.S. PATENT DOCUMENTS

| | | | |
|---|---|---|---|
| 3,751,647 | 8/1973 | Maeder et al. | 364/490 |
| 4,724,378 | 2/1988 | Murray et al. | 371/27 |
| 4,875,002 | 10/1989 | Sakamoto et al. | 364/552 X |
| 4,937,765 | 6/1990 | Shupe et al. | 364/578 X |
| 4,965,799 | 10/1990 | Green et al. | 371/27 X |
| 4,967,387 | 10/1990 | Shibasaki et al. | 364/580 |

*Primary Examiner*—Emanuel T. Voeltz
*Assistant Examiner*—Edward Pipala
*Attorney, Agent, or Firm*—Laff, Whitesel, Conte & Saret, Ltd.

[57] ABSTRACT

A semiconductor circuit testing system includes a semiconductor testing device, a probing device, and controls. The controls are connected to the semiconductor testing device and the probing device in order to automate a yield control of a semiconductor wafer testing process. Measurement data relative to semiconductor wafer is collected when the production number of wafers is less than a standard yield. When the output yield reaches a standard number the probing device is stopped.

1 Claim, 3 Drawing Sheets

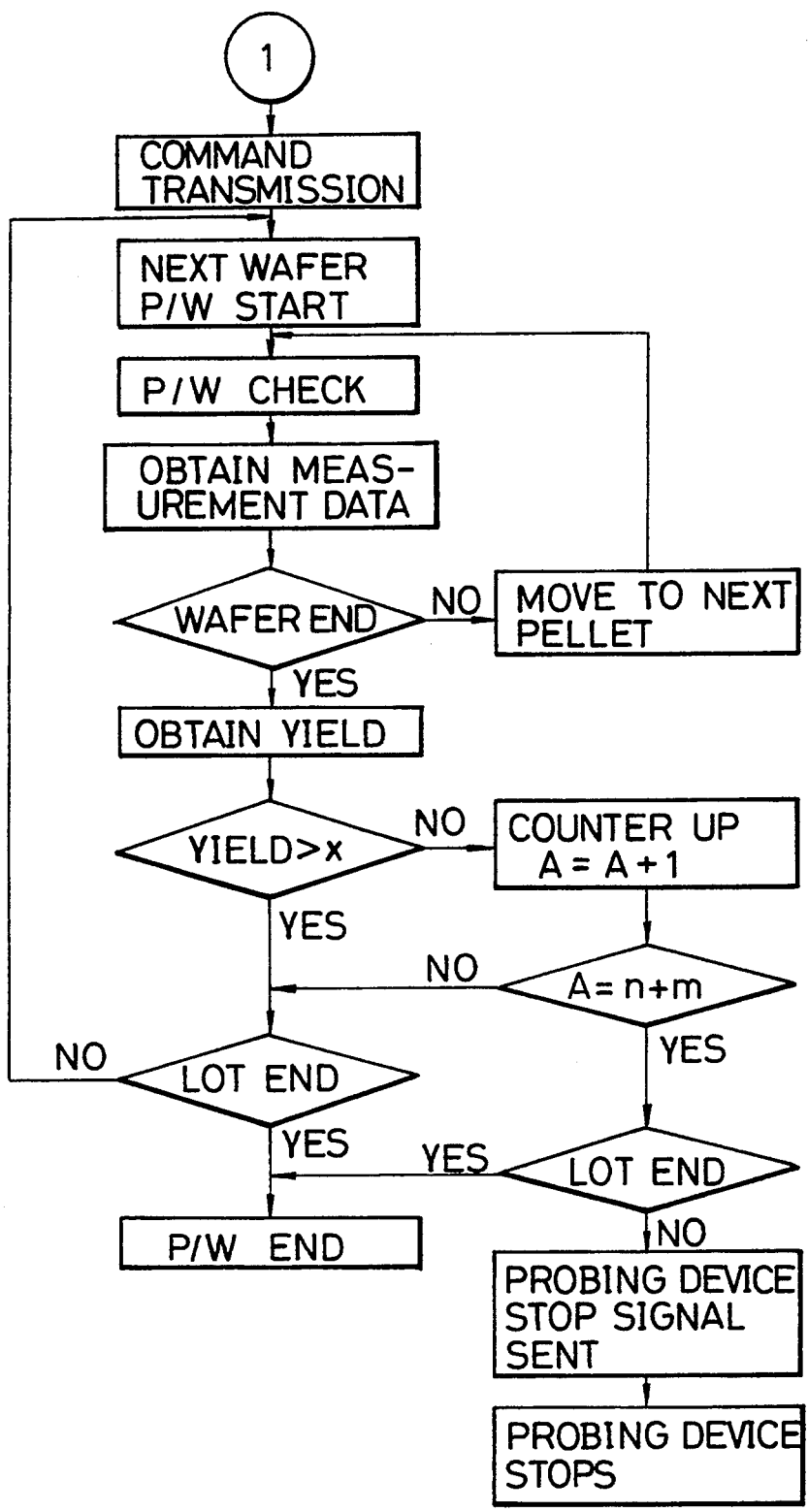

CONTROL SYSTEM FOR SEMICONDUCTOR CIRCUIT TESTING SYSTEM

BACKGROUND OF THE INVENTION

1. Field of the Invention

This invention is related to a semiconductor circuit testing system which is used in a semiconductor device testing system, and in more particular it relates to a control device of a semiconductor device testing system which performs yield control and automatic collection of measurement data, and stops the probing device.

2. Description of the Prior Art

In prior semiconductor device testing systems of this kind, there was a means for stopping aimed at preventing a decrease in yield when device failure occurred in either the semiconductor testing device or the probing device. However, it did not control the yield in wafer units and did not detect yield abnormalities of lots. This kind of yield control required human intervention to stop the semiconductor testing system when it reached a specified standard. Also, in order to investigate the cause of the yield abnormalities, it was necessary to know by which measurement data the pellet of the wafer with the yield abnormality was judged to be bad. However, this measurement data was output after a command was sent manually to the semiconductor testing device and then measurement of the pellet was completed and so normally, when yield abnormalities occurred, stopping the device, sending the command, and collecting the measurement data were all performed manually. Also, depending on the semiconductor testing device, there were devices that could store the measurement data, however, storage was controlled in lot units and not in wafer units and so it was not understood which measurement data was that of the wafer with bad yield.

In the prior semiconductor testing device, there was no control device to perform automatic control of the semiconductor device testing system, and so the functions of each device were performed by human intervention, thus yield control, collection of measurement data, and stopping the device were all performed manually.

In this kind of prior semiconductor device testing system, the series of operations; yield control in wafer units, collecting the measurement data of the measured pellet after a yield abnormality, and stopping the device when it reached specified conditions, were all performed manually, therefore it was difficult to reduce the number of people in a line or to create a unmanned line. Also, depending on the semiconductor testing device, there were cases when collection of the measurement data of the bad pellet after a yield abnormality occurred needed to be performed by manual control, which caused decrease in through put of the semiconductor testing device.

SUMMARY OF THE INVENTION

An object of this invention is to provide a semiconductor circuit testing system which can automate yield control and eliminate the problems mentioned above.

The object of this invention as mentioned above is accomplished by providing a semiconductor circuit testing system which is more effective and which comprises a semiconductor testing device that measures the functions and electrical characteristics of a semiconductor circuit made on a wafer; a probing device with a means for calculating the yield in wafer units based on the measurement data measured by the semiconductor testing device; a means for comparison which compares the yield of each wafer obtained from the probing device with a specified standard yield; an increment counter which counts the number of times the yield of each wafer obtained from the probing device, which is the comparison result of the comparison means, is less than the standard yield; a means for judging when the number of wafers calculated by the counter reaches a specified standard number of wafers; a command transmitter which requests the semiconductor testing device to output the measurement data when the judgement means determines that the value calculated by the counter has reached the specified number of wafers; a measurement data memory area which stores in wafer units the measurement data received from the semiconductor testing device; and a means for stopping the probing device when the number of wafer units with measurement data stored in the measurement data memory area reaches the specified number of wafers of measurement data to be collected.

Measurement of the electrical characteristics of the pellet in the wafer is performed by the semiconductor testing device, and after testing of one wafer is completely finished, the control device obtains the wafer yield from the probing device and the number of wafers for which the yield is less than the set standard is counted. When the number of wafers reaches a set number, the controller sends a command from the command transmitter to the semiconductor testing device requesting that the measurement data be output. The measurement data output from the semiconductor testing device is stored in the measurement data memory area, and after data is collected for the specified number of wafers, the controller sends a stop signal to the probing device and stops it.

BRIEF DESCRIPTION OF THE DRAWINGS

The aforementioned and other objects, features and advantages of the present invention will become more apparent from the following description taken with reference to the accompanying drawings, wherein;

FIG. 3 is a flowchart showing the operation of an embodiment of this invention.

DESCRIPTION OF THE PREFERRED EMBODIMENTS

Below, an embodiment of this invention will be described with reference to the drawings.

Figure 1:
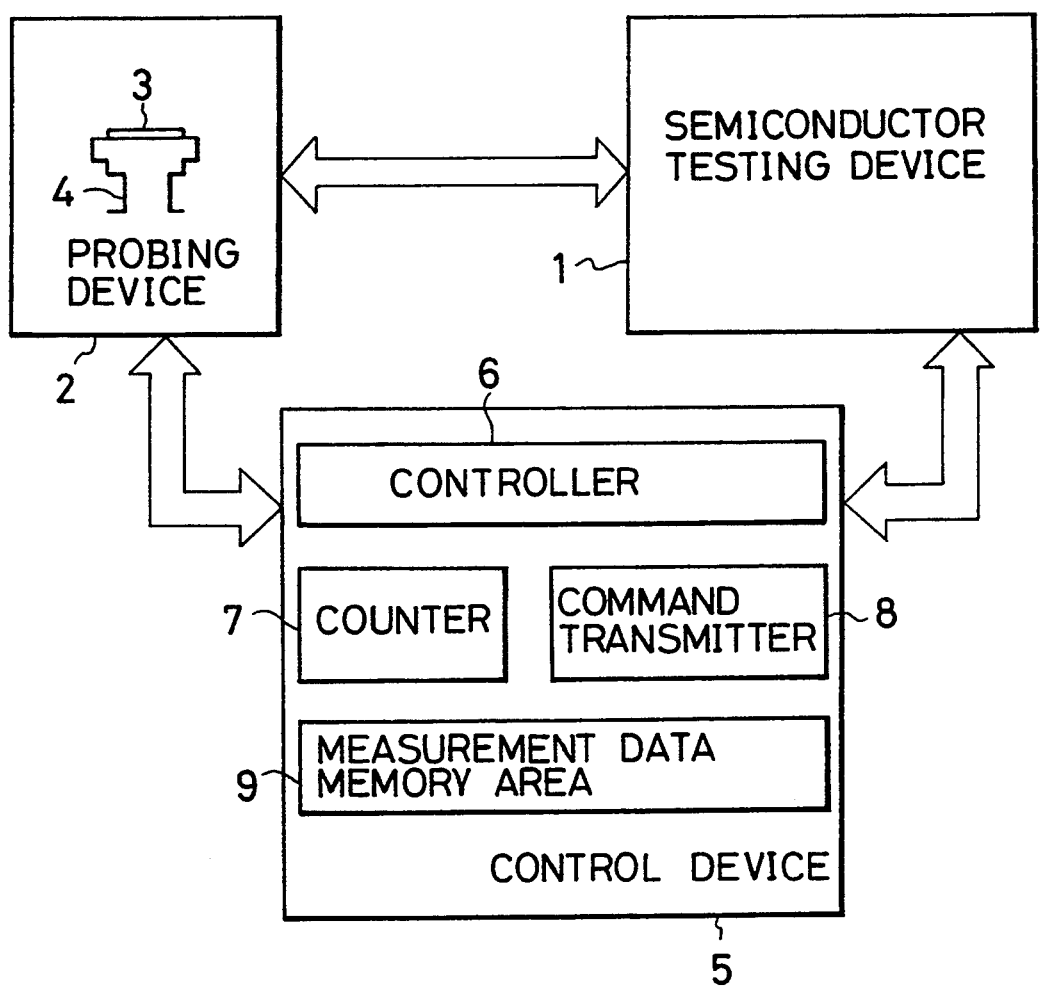
FIG. 1 block diagram showing the configuration of an embodiment of this invention.

FIG. 1 is a block diagram showing the configuration of this embodiment.

A semiconductor circuit testing system of this embodiment, as shown in FIG. 1, comprises a semiconductor testing device 1 which measures the functions and electrical characteristics of a semiconductor circuit built on a wafer, a probing device 2 that has a means for calculating the yield in wafer units based on the measurement data measured by the semiconductor testing device 1, also, according to this invention, comprising a means of comparison for comparing the yield of each wafer obtained from the probing device 2 with a set standard yield, an increment counter 7 for counting the number of times the yield of each wafer obtained from the probing device 2, which is the comparison result of the comparison means, is less than the standard yield, a means of judgement for determining when the value of the counter 7 reaches the set standard number of wafers, a command transmitter 8 which requests the semiconductor testing device 1 to output the measured data when the judgement means has determined that the value of the counter 7 has reached the standard number of wafers, a measurement data memory area 9 which stores in wafer units the measurement data received from the semiconductor testing device 1, and a means for stopping which stops the probing device 2 when the measurement data in wafer units stored in the measurement data memory area 9 reaches the set number of wafers of measurement data to be collected. The aforementioned comparison means, judgement means, and stopping means are included in a controller 6. A characteristic of this invention is that a control device 5 is connected to a prior semiconductor testing device 1 and probing device 2.

Figure 2:
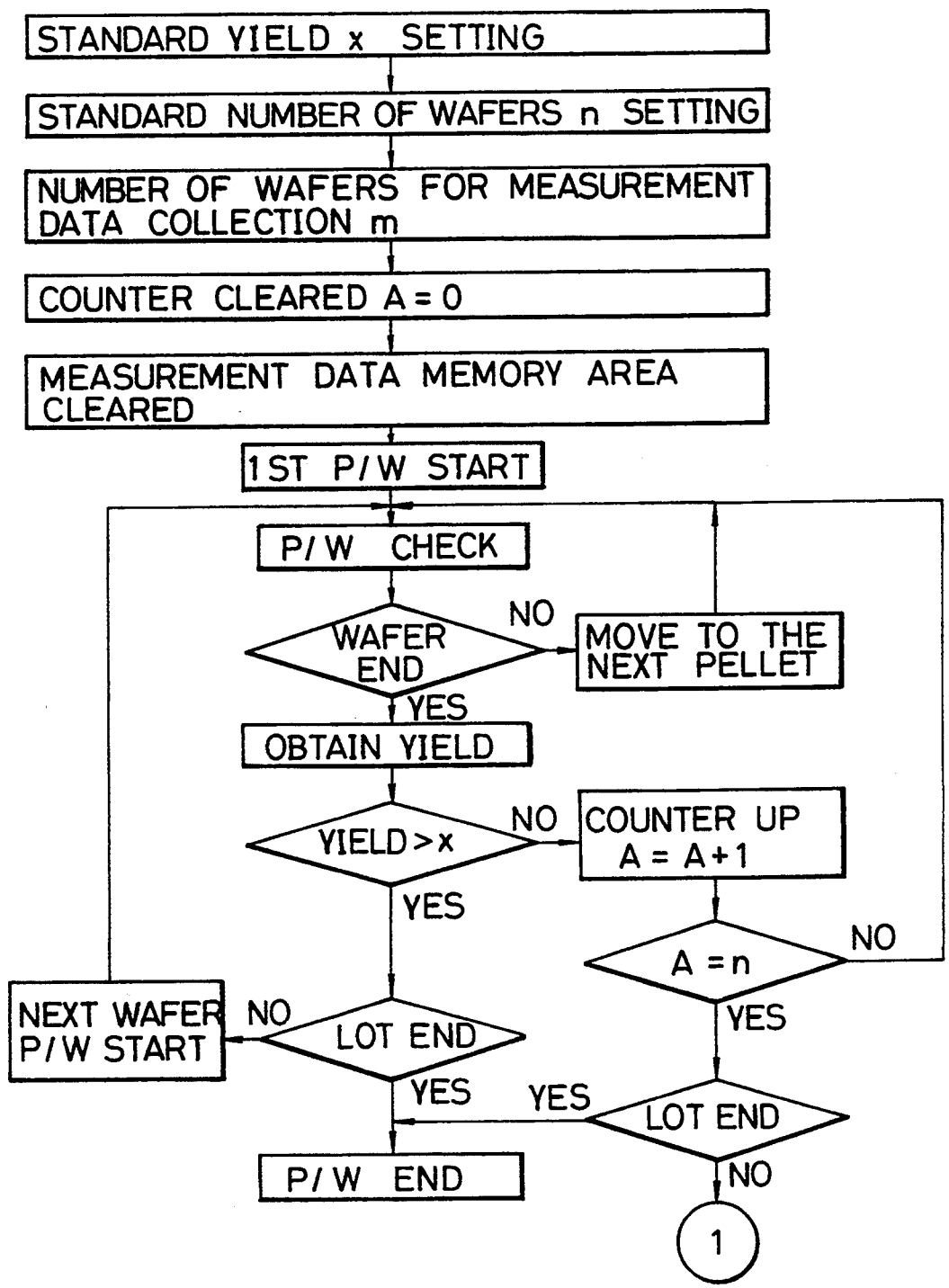
FIG. 2 is a flowchart showing the operation of an embodiment of this invention.

The operation of this control device 5 is described by using the flowcharts of FIGS. 2 and 3. FIG. 2 shows the yield control process. First, in this process, when the rate of the non-defective units or chips for each wafer of a certain lot is checked, at the point the number of wafers, which are less than the standard yield, reaches the standard number, this portion of measurement data is collected, and the probing device is stopped. Before starting the check of the non-defective unit rate for each wafer, the standard yield (x), standard number of wafers (n), and the number of wafers of measurement data to be collected (m) is set in the controller 6, and the counter 7 and measurement data memory area 9 are cleared. The non-defective unit rate for each wafer is checked by the semiconductor testing device 1 and the probing device 2, and when the check of the non-defective unit rate has been completed for one entire wafer, wafer end is set and the control device 5 obtains the yield from the probing device 2 and compares it with the standard yield (x). If it is smaller than the standard yield (x), the counter 7 is counted up and the non-defective unit rate for each wafer is continuously checked until the number of wafers equals the standard number of wafers (n).

Next, FIG. 3 shows the flowchart from the automatic collection function of measurement data to the stopping function of the probing device. At the point that the number of wafers, which are less than the standard yield (x), equals the standard number of wafers (n), the controller 6 judges that there is an abnormal yield and sends a request from the command transmitter 8 to the semiconductor testing device 1 to output the measurement data, and the check of non-defective unit rate for the next wafer begins. The output of measurement data from the semiconductor testing device 1 is set, therefore the measurement data of the measured pellet is output to the control device 5 and the controller 6 of the control device 5 stores the measurement data in the measurement data memory area 9. This is repeated until the measurement data of the wafers which are less than the standard yield reaches the set number of wafers of measurement data to be collected (m), and then the controller 6 sends a stop signal to the probing device 2 and stops the probing device 2.

As described above, by adding a control device to the prior semiconductor device testing system, this invention can automatically perform yield control and collection of measurement data, and stop of the probing device, effectively making it possible to automate the check of the non-defective unit rate for each wafer and reduce the required manpower.

Also, because collection of measurement data is performed automatically, it is not necessary to collect data using manual control, therefore effectively increasing the throughput of the semiconductor testing device.

What is claimed is:

1. A semiconductor circuit testing system comprising:
   a semiconductor testing device for measuring the functions and electrical characteristics of semiconductor circuits made on a wafer;
   a probing device with means for calculating a yield for each wafer based on measurement data provided by said semiconductor testing device;
   comparison means for comparing a yield of each wafer provided by said probing device, with an acceptable standard yield;
   a counter for counting a number of defective wafers having a yield less than said acceptable standard yield in response to the results obtained from said comparison means;
   judgment means responsive to said counter for detecting whether said number of defective wafers has reached a specified standard number;
   a command transmitter for requesting said semiconductor testing device to output the measurement data in response to said judgment means detecting that said number of defective wafers has reached said specified standard number;
   a measurement data memory area for storing therein the measurement data received from said semiconductor testing device so that the measurement data for each wafer can be differentiated from each other; and
   means for stopping said probing device when the measurement data stored in said measurement data memory area indicates that a number of said defective wafers has reached another specified number.

* * * * *